(12) United States Patent
Narwade et al.

(10) Patent No.: US 9,886,753 B2
(45) Date of Patent: Feb. 6, 2018

(54) VERIFICATION OF CIRCUIT STRUCTURES INCLUDING SUB-STRUCTURE VARIANTS

(71) Applicant: Synopsys, Inc., Mountain View, CA (US)

(72) Inventors: Mahantesh Narwade, Karnataka (IN); Namit Gupta, San Jose, CA (US); Kaushik De, Karnataka (IN); Rajarshi Mukherjee, Karnataka (IN); Suman Nandan, Karnataka (IN); Subhamoy Pal, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 279 days.

(21) Appl. No.: 14/540,021

(22) Filed: Nov. 12, 2014

(65) Prior Publication Data
US 2015/0131894 A1    May 14, 2015

(30) Foreign Application Priority Data
Nov. 12, 2013 (EP) .................................... 13192540

(51) Int. Cl.
*G06T 7/00* (2017.01)
*G06F 17/50* (2006.01)
*G06K 9/48* (2006.01)

(52) U.S. Cl.
CPC .......... *G06T 7/0008* (2013.01); *G06F 17/504* (2013.01); *G06F 17/5081* (2013.01); *G06K 9/48* (2013.01); *G06T 2207/30148* (2013.01)

(58) Field of Classification Search
CPC ....... G06T 2207/30148; G06F 17/5068; G06F 17/5081; G06F 17/5045; G06F 17/505; G06F 17/5054
See application file for complete search history.

(56) References Cited

U.S. PATENT DOCUMENTS

| | | | | |
|---|---|---|---|---|
| 8,644,589 B2* | 2/2014 | Hsu | ........................ | G03F 1/144 382/144 |
| 2004/0023128 A1* | 2/2004 | Yamamoto | .............. | G03F 1/144 430/5 |
| 2008/0244493 A1* | 10/2008 | Finkler | ............... | G06F 17/5068 716/119 |
| 2009/0271749 A1 | 10/2009 | Tang et al. | | |

* cited by examiner

*Primary Examiner* — Wesley Tucker
(74) *Attorney, Agent, or Firm* — HIPLegal LLP; Judith Szepesi

(57) ABSTRACT

A method for controlling the functional output of a verification tool upon receipt of a circuit description comprises searching for a predetermined base pattern in the circuit description. The method further comprises searching for predetermined sub-patterns that are assigned to the base pattern, in the circuit description. The method further comprises the validation of each found sub-pattern based on a predetermined rule to minimize the set of reported errors that based on verification of the circuit description.

19 Claims, 9 Drawing Sheets

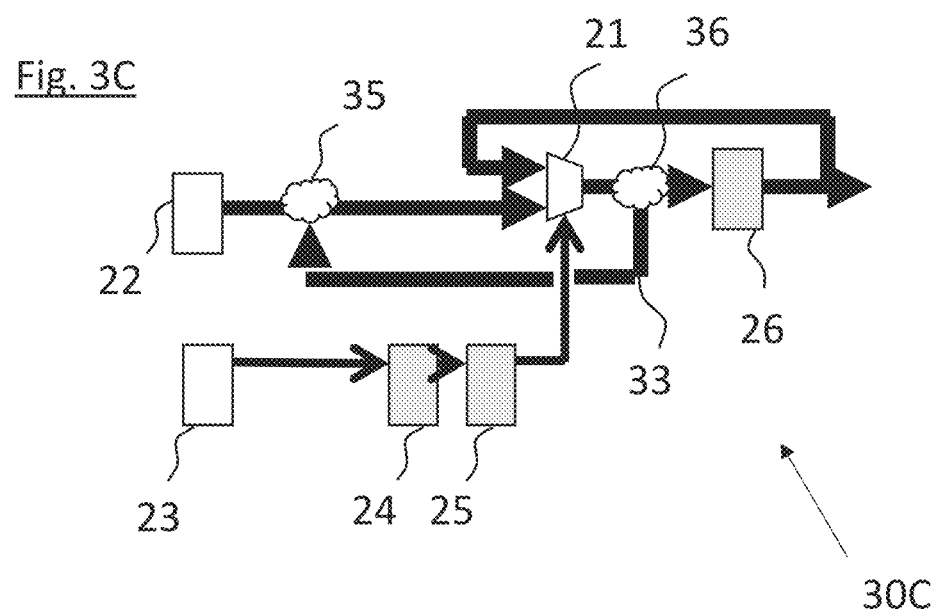

VERIFICATION OF CIRCUIT STRUCTURES INCLUDING SUB-STRUCTURE VARIANTS

RELATED APPLICATIONS

The present application claims priority to European Patent Application No. 13192540.6, filed on date Nov. 12, 2013, and incorporates that application by reference in its entirety.

FIELD

The present invention relates to the art of electronic design automation, and more specifically to verification of structures within an integrated circuit design.

BACKGROUND

In integrated circuit design, verification tools are used to automatically check chip design structures. These tools need to analyze design structure by, e.g., clock domain crossing verification or low power structural verification. In such an analysis a tool searches for predetermined design patterns. When a pattern is found, characteristic parameters are determined. For example, input and output clock of logic blocks can be determined and analyzed. If the tool detects a mismatch in input and/or output an error is generated and presented to a user.

Design structures with the same technical functionality can be implemented in several different ways using different structures. Verification tools match specific structural patterns, rather than functionality. When the predetermined pattern is verified, a user can manually waive errors generated by that predetermined pattern. Variations of an approved predetermined pattern are not detected as also verified by the tool, because they do not structurally match the predetermined pattern. Therefore, the variations cause the verification tool to report the same or similar errors because they do not match the predetermined pattern. These errors also have to be waived by a user manually. This error waiving can be very time intensive when several thousand errors have to be reviewed and waived.

BRIEF DESCRIPTION OF THE FIGURES

The present invention is illustrated by way of example, and not by way of limitation, in the figures of the accompanying drawings and in which like reference numerals refer to similar elements and in which:

FIGS. 3A to 3C show simplified block diagrams as examples of a circuit design representing three variations of the base pattern shown in FIG. 2A.

DETAILED DESCRIPTION

Figure 1:
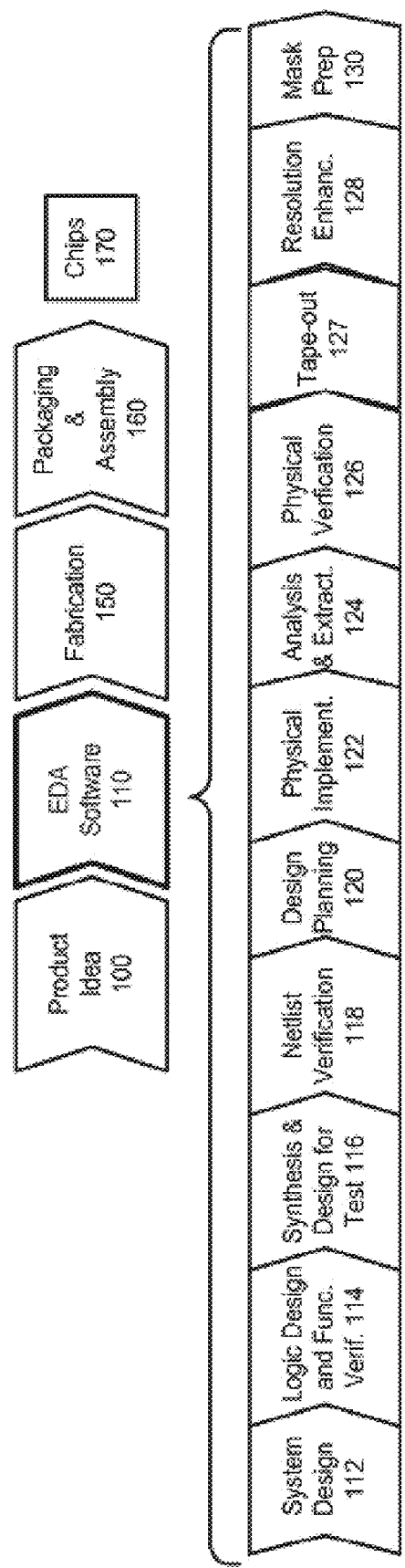
FIG. 1 is a simplified representation of an illustrative digital integrated circuit design flow.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

According to one embodiment, a method for controlling the functional output of a verification tool upon receipt of a circuit description. The integrated circuit description typically includes a listing of cell elements and interconnections there between and is stored as data within one or more computer readable memory units of a computer system. The integrated circuit description may be in VHDL, Verilog, or another language. The method comprises searching for a predetermined base pattern in the circuit description. The method further comprises searching for predetermined sub-patterns in the circuit description that are assigned to the base pattern. Each of the found sub-patterns is validated based on a predetermined rule to minimize a set of reported errors based on verification of the circuit description.

For example, such method or a corresponding system may perform a circuit design pattern recognition. A base pattern may be a part of a structural design. Sub-patterns that are assigned to the base pattern show circuit designs that are associated with the circuit design of the base pattern. Sub-patterns contain one or more comparable circuit elements arranged similarly to the base pattern. By searching for both kinds of patterns, the verification tool increases the probability of identifying a known circuit design structure. By validating the found sub-patterns based on a predetermined rule, the verification tool can assign a verification result to the sub-patterns. A positive verification result may allow the verification tool to suppress errors that would otherwise be caused by the sub-patterns.

In addition, the predetermined sub-patterns are dependent on the predetermined base pattern. By using sub-patterns that are dependent on the predetermined base pattern a circuit design can easily be defined by a user. Dependent in this context means a similar arrangement of comparable circuit elements as the base pattern.

In one embodiment each predetermined sub-pattern comprises variations of the design structure of the predetermined base pattern. A company may have several variations of a circuit design pattern. By assigning these variations in the design to a predetermined base pattern the verification tool can be handled and used more precisely.

In further embodiments of the method a design structure can be defined as a predetermined base pattern. In addition, a design structure can be defined as a predetermined sub-pattern. Further, the predetermined rule can be set prior to use of the verification tool or during the use of the verification tool. In these embodiments a user has full control over the functionality of the verification tool.

In one embodiment, the predetermined rule comprises a validation for each predetermined sub-pattern separately. Hereby a user can define the rule in detail and therefore gains an increased amount of control over the analysis tool.

In one embodiment, the predetermined rule determines at least one predetermined sub-pattern as a valid sub-pattern. In one embodiment, an amount of sub-patterns that are determined as valid is lower than a total amount of predetermined sub-patterns. By validating a selection of the predetermined sub-patterns the efficiency in validating of the found sub-patterns can be increased.

In one embodiment, the validation comprises a comparison of found sub-patterns with combinations of sub-patterns that are determined as valid. By combining several sub-patterns in the validation, more complex circuit design structures can be analyzed.

In one embodiment, the method comprises generating one or more errors for each sub-pattern that was validated negatively. These errors can be presented to a user in an error message. With this error message, a user can be informed that an error occurred in the validation.

In one embodiment, a plurality of base patterns may be validated. One or more sub-pattern variations of each base pattern may be validated along with the base patterns. In one embodiment, the verification tool uses a pattern design recognition to perform the searching. In one embodiment, the pattern design recognition is employed in at least one of the following techniques: (1) low power structural verification, (2) clock domain crossing verification, (3) structural linting.

Furthermore, in one embodiment, a system for controlling the functional output of a verification tool upon receipt of a circuit description is described. The system has a memory device being adapted to store predetermined base patterns and predetermined sub-patterns. The system further has a processor being adapted to search for a predetermined base pattern and predetermined sub-patterns in the circuit description and that is further adapted to validate each found pattern based on a predetermined rule to minimize the set of reported errors that based on verification of the circuit description.

Using such a system for design analysis all embodiments of the method described above can be executed on the processor.

Furthermore, a computer program product is described that comprises a code, said code being configured to implement a method according to one of the previously described embodiments.

In one embodiment, a non-volatile machine readable medium contains executable computer program instructions which, when executed by a digital processing system, cause said system to perform a method for verifying circuit structures in a portion of an integrated circuit design. In one embodiment, the method for verifying circuit structures in a portion of an integrated circuit design comprises searching the integrated circuit design for a predetermined base pattern. In one embodiment, the base pattern is comprised of an arrangement of one or more logic elements. In one embodiment, the method for verifying circuit structures in a portion of an integrated circuit design comprises searching the integrated circuit design for one or more predetermined sub-patterns.

In one embodiment, one or more of the sub-patterns is comprised of an arrangement of one or more logic elements. In one embodiment, one or more of the sub-patterns have a similar arrangement of comparable circuit elements as the base pattern. In one embodiment, one or more of the sub-patterns has a similar clock domain as the base pattern. In one embodiment, one or more of the sub-patterns has a different clock domain as the base pattern. In one embodiment, each found sub-pattern is validated based on a predetermined rule, resulting in a minimized set of reported errors return after verifying circuit structures in the integrated circuit. In one embodiment, the similar arrangement of comparable circuit elements comprises the base pattern and one or more of additional logic elements and interconnect.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the claims of the present invention. Thus, the present invention is not intended to be limited to the embodiments shown, but is to be accorded the widest scope consistent with the claims and the description.

Overall Design Process Flow

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur, resulting ultimately in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect™, Saber™, System Studio™ and DesignWare™ products.

Logic design and functional verification (step 114): At this stage, the VHDL or Verilog code for modules in the system is written and the design is checked for functional accuracy. More specifically, the design is checked to ensure that it produces correct outputs in response to particular inputs. Example EDA software products from Synopsys, Inc. that can be used at this step include VCS™, VERA™, DesignWare™, Magellan™, Formality™, ESP™ and LEDA™ products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler™, Physical Compiler™, DFT Compiler™, Power Compiler™, FPGA Compiler™ TetraMAX™, and DesignWare™ products.

Netlist verification (step 118): At this step, the netlist is checked for compliance with timing constraints and for correspondence with the VHDL/Verilog source code. Example EDA software products from Synopsys, Inc. that can be used at this step include Formality™, PrimeTime™, and VCS™ products.

Design planning (step 120): Here, an overall floor plan for the chip is constructed and analyzed for timing and top-level routing. Example EDA software products from Synopsys, Inc. that can be used at this step include Astro™ and Custom Designer™ products.

Physical implementation (step 122): The placement (positioning of circuit elements) and routing (connection of the same) occurs at this step. Example EDA software products from Synopsys, Inc. that can be used at this step include the Astro™, IC Compiler™, and Custom Designer™ products. Aspects of the invention can be performed during this step 122.

Analysis and extraction (step 124): At this step, the circuit function is verified at a transistor level, this in turn permits what-if refinement. Example EDA software products from Synopsys, Inc. that can be used at this step include Astro-Rail™, PrimeRail™, PrimeTime™, and Star-RCXT™ products.

Physical verification (step 126): At this step various checking functions are performed to ensure correctness for: manufacturing, electrical issues, lithographic issues, and circuitry. Example EDA software products from Synopsys, Inc. that can be used at this step include the Hercules™ product. Aspects of the invention can be performed during this step 126 as well.

Tape-out (step 127): This step provides the "tape-out" data to be used (after lithographic enhancements are applied if appropriate) for production of masks for lithographic use to produce finished chips. Example EDA software products from Synopsys, Inc. that can be used at this step include the IC Compiler™ and Custom Designer™ families of products.

Resolution enhancement (step 128): This step involves geometric manipulations of the layout to improve manufacturability of the design. Example EDA software products from Synopsys, Inc. that can be used at this step include Proteus™, ProteusAF™, and PSMGen™ products.

Mask data preparation (step 130): This step provides mask-making-ready "tape-out" data for production of masks for lithographic use to produce finished chips. Example EDA software products from Synopsys, Inc. that can be used at this step include the CATS™ family of products. Often this step includes partitioning or fracturing non-rectangular shaped islands into rectangles.

Figure 2A:
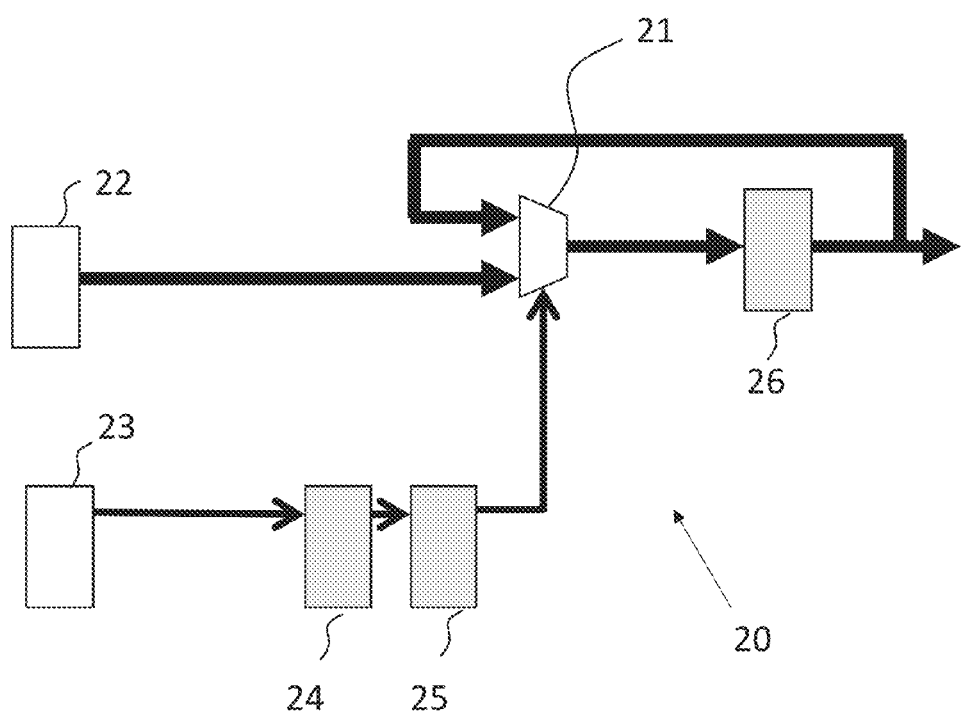
FIG. 2A is a simplified block diagram showing an example of a circuit design representing a base pattern.

Now referring to FIG. 2A, a schematic circuit design structure is shown that is exemplarily defined as a base pattern 20.

The base pattern 20 shown in FIG. 2A is a circuit design structure defined as a base pattern 20 by a user. It shows a logic gate 21. The logic gate 21 has three inputs. Logic gate 21 has a data input coming from a logic block 22. The logic gate 21 has another data input coupled from a back loop from the output of the logic gate 21. The logic gate 21 further has a control input coming from the control serial coupling of logic gates 23, 24 and 25. An output data bus includes logic block 26. Logic blocks 22 and 23 have the same clock domain, in one embodiment. Logic blocks 24, 25 and 26 have the same clock domain, differing from the first clock domain, in one embodiment. The shading in the figure indicates the clock domain used. While the clock of logic block 22 leads directly to the data input of logic gate 21, the clock of logic block 23 is changed in logic blocks 24 and 25. This clock domain structure is set as a valid clock domain structure in the base pattern 20.

Figure 2B:
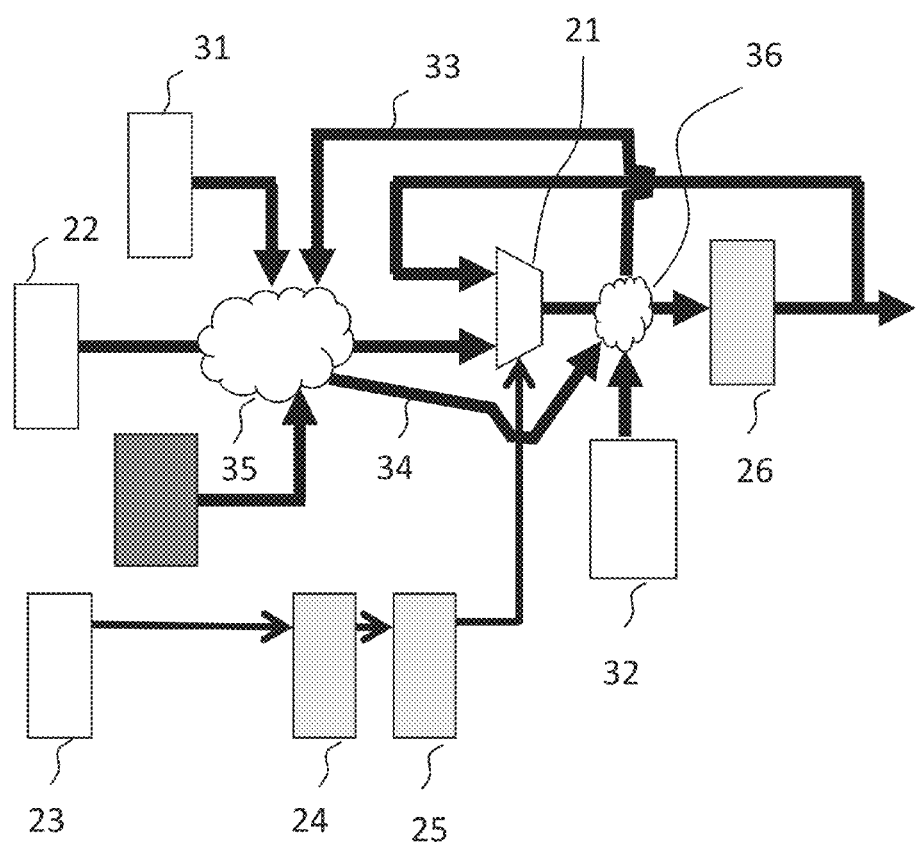
FIG. 2B is a simplified block diagram showing an example of a circuit design representing a superposition of variations of the base pattern that match the base pattern shown in FIG. 2A.

Complex design structures can be found in a circuit description by searching for a base pattern if the complex design structure includes the design structure of the base pattern. The complex design structure can further include known and/or unknown variations of the base pattern. For example, the schematic block diagram shown in FIG. 2B depicts a circuit design that can be found in a circuit description using the base pattern 20. In this example several structures with different clock domains are added as atomic variations to the circuit design of the base pattern 20. An analysis tool for circuit design would present an error for each of the separate atomic variations and for combinations of the atomic variations. To handle the output of errors for the specific variations from the base pattern, according to one embodiment, a user can define these atomic variations as sub-structures, or sub-patterns, of the base pattern 20. In an alternative implementation the sub-patterns and/or the base pattern 20 are predefined, e.g. by a provider of the analysis tool or by the user. Additional elements 31 to 35 are explained in the description of FIGS. 3A to 3B.

Figure 3A:
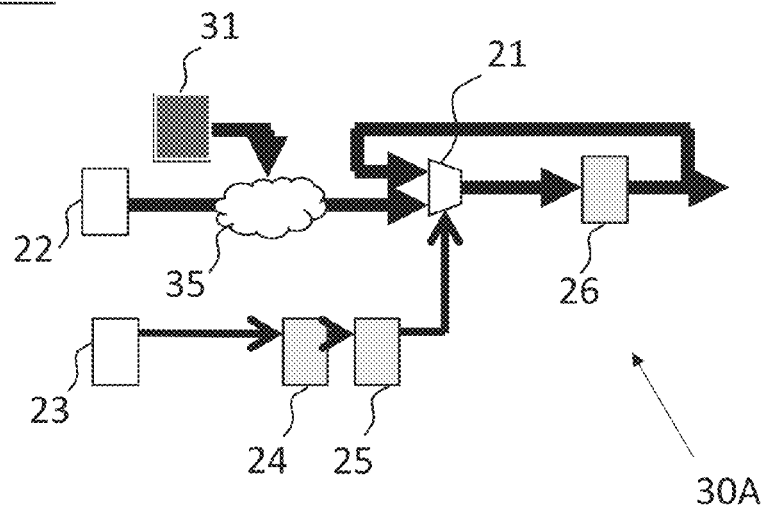

FIGS. 3A, 38 and 3C show variations of the schematic logic block design of the base pattern 20. Each of FIGS. 3A, 38, and 3C represents an exemplary sub-structure, or sub-pattern, of the structure of FIG. 2A. In one embodiment, the input and output clock domains of the sub-patterns can vary from the clock domains of the base pattern 20.

In the sub-pattern 30A shown in FIG. 3A, an additional logic block 31 is added to the logic structure of the base pattern. Logic block 31 adds an additional clock domain to the data input of the logic gate 21 at a static logic element 35.

Figure 3B:
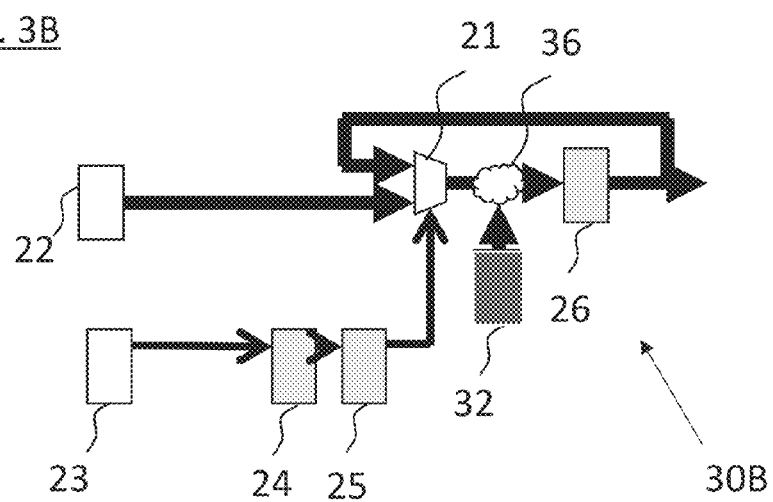

Logic block 32 adds an additional clock domain to the output of logic gate 21 at static logic element 36 as shown in sub-pattern 30B in FIG. 3B.

Another variation of the base pattern 20 is shown as sub-pattern 30C in FIG. 3C. A new circuit loop 33 which leads back to the static logic element 35 is defined in the variation of FIG. 3C.

Figure 4:
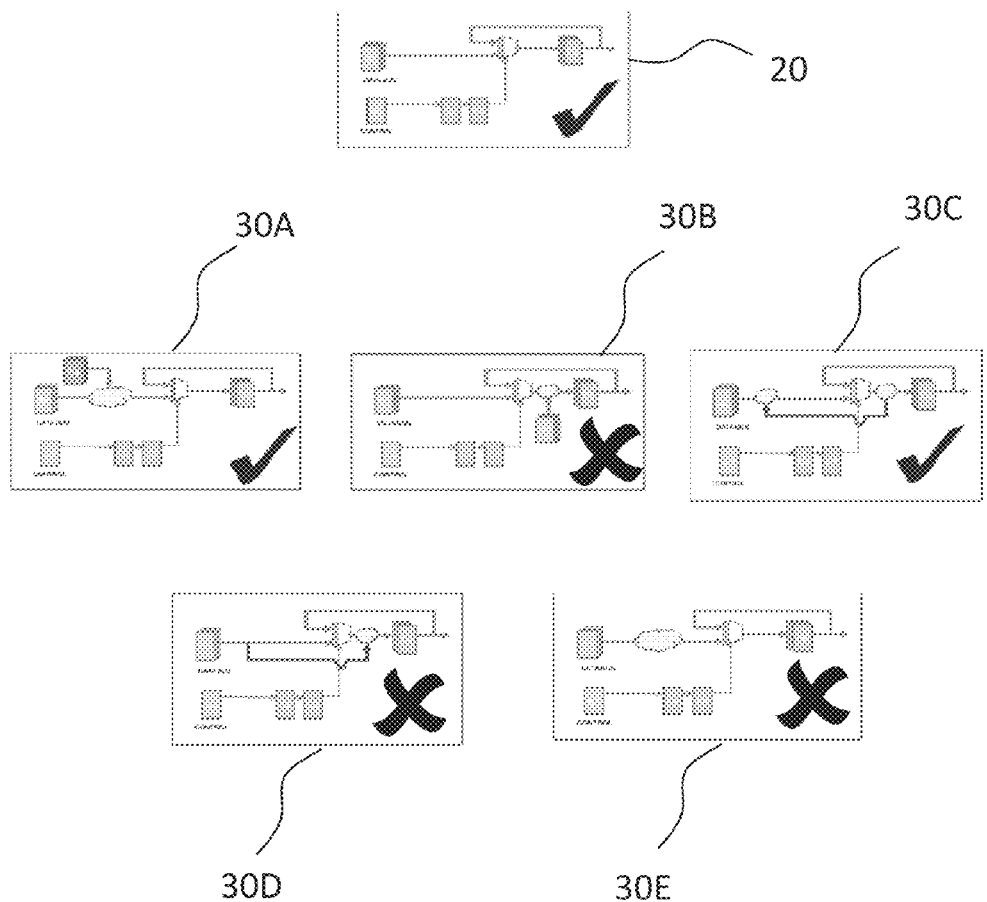
FIG. 4 shows an example of a rule for validating found sub-patterns.

For validating the sub-patterns, the provider of the verification tool or a user can set one or more rule for the validation process. FIG. 4 shows an example of a rule including the base pattern 20 and several sub-patterns: the sub-patterns shown in FIGS. 3A to 3C as well as additional sub-patterns 30D and 30E. The provider of the verification tool or a user can set a rule to mark the base pattern 20 as valid. The sub-patterns 30A and 30C showing variations of the base pattern 20 are marked as valid, too. In contrast to sub-patterns 30A and 30C, the sub-pattern 30B and the additional sub-patterns 30D and 30E are marked as invalid.

For example, a user may define a rule for validation of found patterns. Valid variations will result in a positive validation. Invalid variations will result in a negative validation. Sub-patterns resulting from a combination of different variations will be validated negatively, if at least one variation, which is marked as invalid, is part of the combination. In one embodiment, sub-patterns resulting from a combination of different variations, all of which are marked as valid, would also be marked valid. In other embodiments, other logic combinations of valid and/or invalid variations may result in a negative or positive validation.

Figure 5:
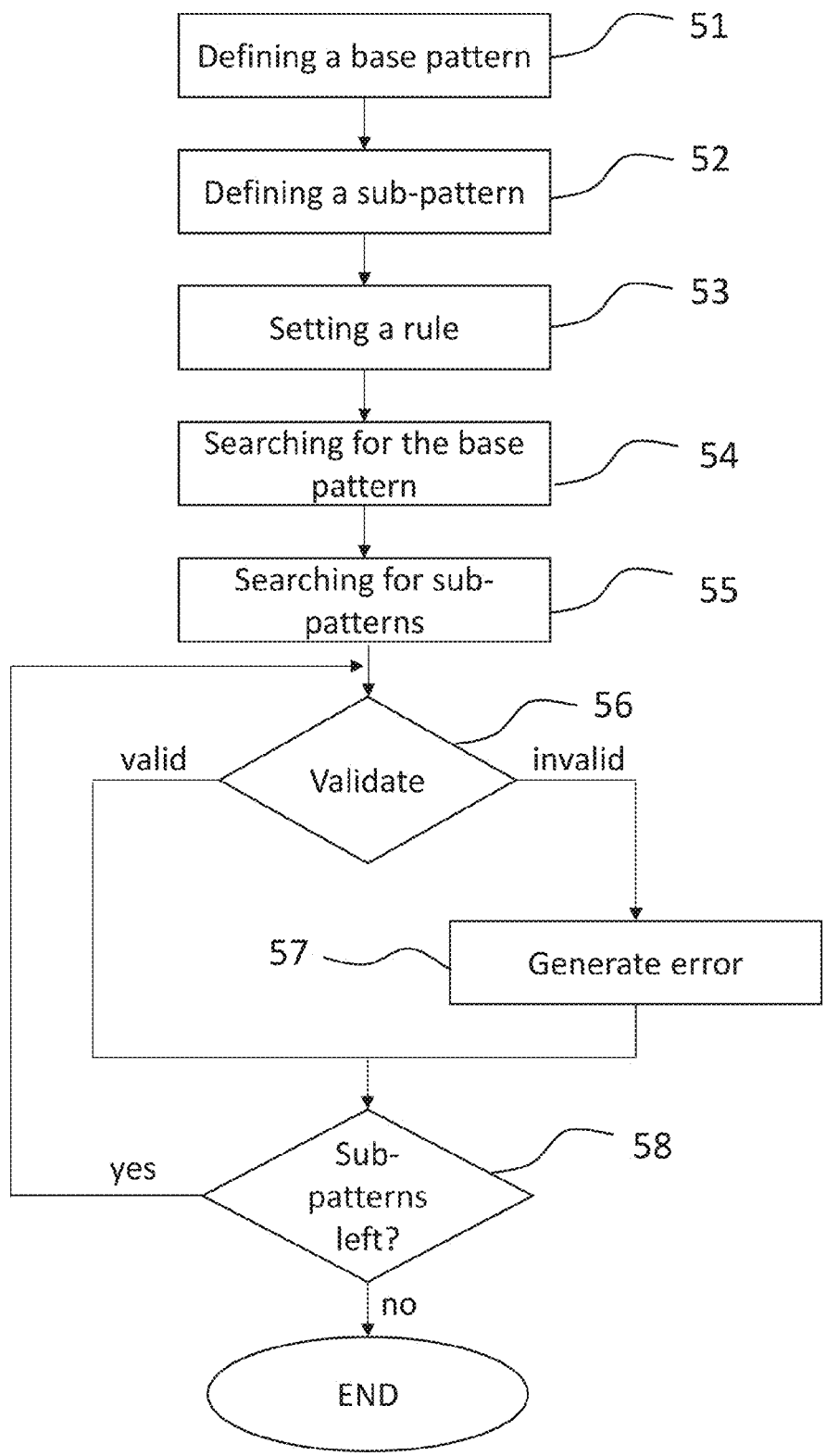
FIG. 5 is a flowchart showing steps of a method of configurable recognition of a design structure pattern and its variants.

FIG. 5 shows a flowchart showing steps for a method for controlling the functional output of a verification tool upon receipt of a circuit description, e.g. employing circuit design pattern recognition. In a first step 51, a user or provider of a verification tool defines a design structure as a predetermined base pattern. In one embodiment, in step 51 the user defines the base pattern 20 as shown in FIG. 2A as the predetermined base pattern.

In step 52 the user or provider defines one or more design structures as predetermined sub-patterns. During this step the user can define numerous sub-patterns, as described above with respect to sub-patterns 30A, 30B and 30C shown in FIGS. 3A to 3C.

The definition of base patterns and sub-patterns can be saved in memory. So the definition of the base pattern and the sub-patterns can be done once and then can be loaded into the software for future use. In one embodiment, these definitions may be done prior to utilizing the tool.

In a next step 53, a predetermined rule is set by the user or provider. In one embodiment, the predetermined rule includes validating one or more of the defined sub-patterns as valid or invalid as shown in FIG. 4. Thus, a user or provider can define which sub-patterns or sub-pattern combinations will be evaluated as positive or negative. A user or provider may set a new rule for different parts of a circuit description and/or for new circuit designs. This rule can be saved for future use. In one embodiment, steps 51 through 53 may be performed in configuring the tool, and may be propagated to multiple users and devices.

In step 54 the predetermined base pattern 20 is searched for in the circuit description. Additionally, in step 55 sub-patterns that are assigned to the base pattern 20 are searched for in the circuit description. For example, in the circuit structures shown in FIG. 2-4, in step 55 sub-patterns, e.g. the sub-patterns 30A to 30E are searched for.

A found circuit design pattern that matches the base pattern 20 can show several properties of sub-patterns 30A to 30C and other atomic variations. For checking the clock domain crossing for the base pattern 20, each found sub-patterns 30A to 30E is being validated on the predetermined rule in step 56. In one embodiment, the clock domain crossing in the base pattern 20 is validated against found sub-patterns 30A to 30E. In one embodiment, the sub-patterns may have different clock domain crossings than the base pattern and each other, and still be validated on the predetermined rule in step 56.

If the validation of a sub-pattern is positive then possible errors that would occur in the base pattern 20 due to the variation in the circuit design pattern, which correspond to the validated sub-pattern, are not considered as errors. In one embodiment, any such errors are automatically waived. Waiving in this context is defined as marking an error as being acceptable. A waived error may not be shown in further analysis steps or validation cycles, and does not need further input from the user. The corresponding error message can be suppressed by the tool, in one embodiment. In another embodiment, such waived errors may be accessible to the user, but not presented as errors that must be addressed.

If the validation in step 56 is negative an error is generated in step 57. The error is saved, in one embodiment, for a later presentation in an error message. In an alternative implementation the error may be presented directly to the user.

In one embodiment, by setting the predetermined rule in step 53, a user can control how optimistically the validation is executed. The validation can be very strict by validating very few or none of the sub-patterns as valid. Then the validation of step 57 will result in many produced errors. This again leads to a huge amount of time that has to be spent in waiving errors manually.

On the other hand, the rule of step 53 can be set very optimistically. This can be done by marking many of the sub-patterns as valid. If many of the sub-patterns are marked as valid, the verification tool will waive many possible errors automatically. Thus, the user does not have to check all errors. The actual failure rate in the analysis of the design structure using an optimistic setting may be very high. For example, this allows a balance between fast verification and detailed analysis of circuit structure.

In step 58 the process checks if there are found sub-patterns left for validation. If there are sub-patterns left, the method returns to step 56. If all sub-patterns were marked valid or invalid, the method ends.

The steps 51, 52 and 53 can be executed once in an initial definition and setting phase of the analysis tool. The set definitions and the rule can be loaded as predetermined settings for further use. Therefore the method may start with step 54 and continue as described above using the predetermined settings and definitions.

The searching for patterns as defined in steps 54 and 55 can be executed separately from the other steps. Hereby the results of the search are stored to be validated later. The validation of the sub-patterns, in steps 56, 57 and 58 can also be executed as a separate set of steps during the analysis.

Figure 6A:
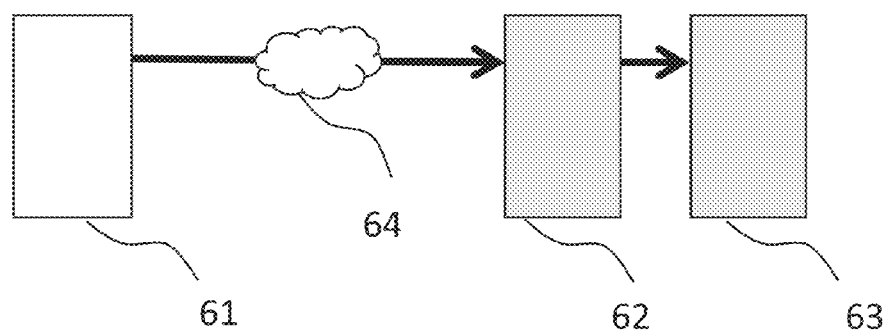
FIG. 6A shows an exemplary logic block circuit design.

In FIG. 6A an exemplary logic block circuit design is shown. Logic blocks 61, 62 and 63 are connected via interconnects or busses, shown as arrows. Between logic block 61 and logic block 62 a static logic element 64 is arranged. Adding the static logic element 64 results in an intended change of the clock signal, so the path from the logic block 61 to the logic block 62 is unsynchronized. If a user defines such a rule, the verification tool may waive an error that is generated by the analysis tool.

Figure 6B:
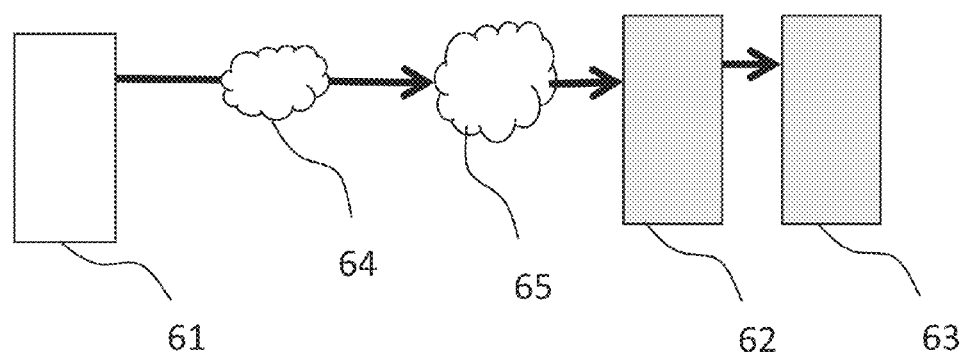
FIG. 6B shows a variation of the exemplary logic block circuit design of FIG. 6A.

FIG. 6B shows the arrangement of FIG. 6A with an additional non-static logic element 65. The additional non-static logic element 65 further varies the clock signal on the bus between logic elements 61 and 62. This additional variation is not intended.

Using a state of the art analysis tool that produces an error for the design of FIG. 6A that has been waived, no other errors concerning this bus connection will be identified. In particular, the new unintended change in the clock signal introduced by non-static logic element 65 will not be detected.

Using the method described above, a user can define a sub-pattern that describes a non-static logic element and the resulting clock change. By marking this sub-pattern as invalid, all further designs using additional non-static logic elements will not be waived automatically.

Figure 7:
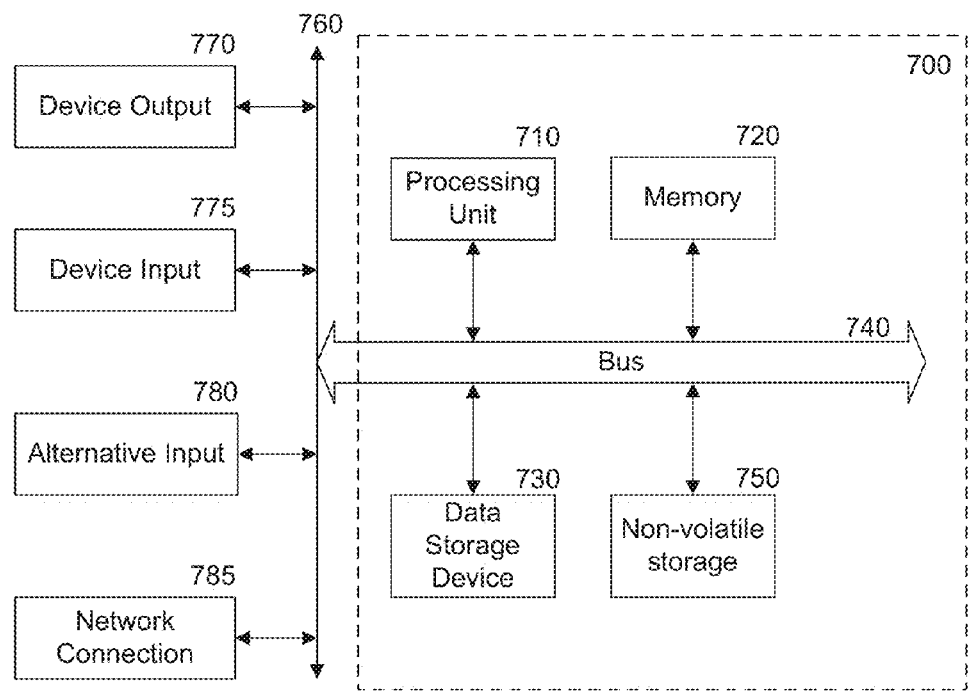
FIG. 7 is a block diagram of one embodiment of a computer system that may be used with the present invention.

FIG. 7 is a block diagram of one embodiment of a computer system that may be used with the present invention. It will be apparent to those of ordinary skill in the art, however that other alternative systems of various system architectures may also be used.

The data processing system illustrated in FIG. 7 includes a bus or other internal communication means 740 for communicating information, and a processing unit 710 coupled to the bus 740 for processing information. The processing unit 710 may be a central processing unit (CPU), a digital signal processor (DSP), or another type of processing unit 710.

The system further includes, in one embodiment, a random access memory (RAM) or other volatile storage device 720 (referred to as memory), coupled to bus 740 for storing information and instructions to be executed by processor 710. Main memory 720 may also be used for storing temporary variables or other intermediate information during execution of instructions by processing unit 710.

The system also comprises in one embodiment a read only memory (ROM) 750 and/or static storage device 750 coupled to bus 740 for storing static information and instructions for processor 710. In one embodiment, the system also includes a data storage device 730 such as a magnetic disk or optical disk and its corresponding disk drive, or Flash memory or other storage which is capable of storing data when no power is supplied to the system. Data storage device 730 in one embodiment is coupled to bus 740 for storing information and instructions.

The system may further be coupled to an output device 770, such as a cathode ray tube (CRT) or a liquid crystal display (LCD) coupled to bus 740 through bus 760 for outputting information. The output device 770 may be a visual output device, an audio output device, and/or tactile output device (e.g. vibrations, etc.)

An input device 775 may be coupled to the bus 760. The input device 775 may be an alphanumeric input device, such as a keyboard including alphanumeric and other keys, for enabling a user to communicate information and command selections to processing unit 710. An additional user input device 780 may further be included. One such user input device 780 is cursor control device 780, such as a mouse, a trackball, stylus, cursor direction keys, or touch screen, may be coupled to bus 740 through bus 760 for communicating direction information and command selections to processing unit 710, and for controlling movement on display device 770.

Another device, which may optionally be coupled to computer system 700, is a network device 785 for accessing other nodes of a distributed system via a network. The communication device 785 may include any of a number of commercially available networking peripheral devices such as those used for coupling to an Ethernet, token ring, Internet, or wide area network, personal area network, wireless network or other method of accessing other devices. The communication device 785 may further be a null-modem connection, or any other mechanism that provides connectivity between the computer system 700 and the outside world.

Note that any or all of the components of this system illustrated in FIG. 7 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 720, mass storage device 730, or other storage medium locally or remotely accessible to processor 710.

It will be apparent to those of ordinary skill in the art that the system, method, and process described herein can be implemented as software stored in main memory 720 or read only memory 750 and executed by processor 710. This control logic or software may also be resident on an article of manufacture comprising a computer readable medium having computer readable program code embodied therein and being readable by the mass storage device 730 and for causing the processor 710 to operate in accordance with the methods and teachings herein.

The present invention may also be embodied in a handheld or portable device containing a subset of the computer hardware components described above. For example, the handheld device may be configured to contain only the bus 740, the processor 710, and memory 750 and/or 720.

The handheld device may be configured to include a set of buttons or input signaling components with which a user may select from a set of available options. These could be considered input device #1 775 or input device #2 780. The handheld device may also be configured to include an output device 770 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 710, a data storage device 730, a bus 740, and memory 720, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 785.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 710. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (e.g. carrier waves, infra-red signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method for controlling the functional output of a circuit verification tool upon receipt of a circuit description, the circuit description describing at least one structure of the elements of a circuit to be verified, the method comprising:
    retrieving a base pattern from memory, the base pattern describing at least one schematic circuit design structure;
    searching for the base pattern in the circuit description;
    further searching for one or more predetermined sub-patterns that are associated with the base pattern in the circuit description, the predetermined sub-patterns describing circuit elements comparable to circuit elements of the base pattern, but respective structures different from the circuit elements of the base pattern;
validating each sub-pattern found in the search of the circuit design based on a plurality of predetermined rules and marking each sub-pattern found, as valid or invalid, wherein a valid sub-pattern is a sub-pattern determined as valid by the predetermined rules; and
suppressing an error notification associated with a particular sub-pattern in the verification tool when the validating determines that the sub-pattern is valid, thus advantageously reducing a number of error notifications output by the verification tool.

2. The method according to claim 1, wherein each of the predetermined sub-patterns comprises variations of a design structure of the predetermined base pattern.

3. The method according to claim 1, wherein the predetermined rule comprises a user defined validation for each predetermined sub-pattern.

4. The method according to claim 1, wherein the predetermined rule determines at least one predetermined sub-pattern as a valid sub-pattern.

5. The method according to claim 4, wherein the validating comprises a comparison of the found sub-patterns with a combination of sub-patterns that are determined as valid.

6. The method according to claim 1, further comprising: generating one or more errors for each of the found sub-patterns that was validated negatively.

7. The method according to claim 1, wherein the validation includes a plurality of base patterns.

8. The method according to claim 1, wherein the searching utilizes a pattern design recognition.

9. The method according to claim 8, wherein the pattern design recognition is for one or more of low power structural verification, clock domain crossing verification, and structural linting.

10. A system for controlling the functional output of a verification tool upon receipt of a circuit description, the system having:
a memory adapted to store a predetermined base pattern and one or more predetermined sub-patterns, each sub-pattern associated with a base pattern, the predetermined sub-patterns describing circuit elements comparable to the circuit elements of the base pattern, but respective structures different from circuit element of the base pattern; and
a processor adapted to search for the predetermined base pattern and the predetermined sub-patterns in the circuit description and to validate each found sub-pattern positively or negatively based on a predetermined rule, the processor to suppress error notifications associated with a particular sub-pattern in the verification tool when the sub-pattern is validated positively, thus advantageously reducing a number of error notifications output by the verification tool.

11. The system according to claim 10, wherein the predetermined sub-patterns are atomic variations of the predetermined base pattern.

12. The system according to claim 11, wherein each predetermined sub-pattern comprises variations of a design structure of the predetermined base pattern.

13. The system according to claim 10, the processor further being adapted to generate one or more errors for each sub-pattern that was validated negatively.

14. The method according to claim 10, wherein the search utilizes a pattern design recognition.

15. The method according to claim 14, wherein the pattern design recognition is for one or more of low power structural verification, clock domain crossing verification, and structural linting.

16. A non-volatile machine readable medium containing executable computer program instructions which when executed by a digital processing system cause said system to perform a method for verifying circuit structures in a portion of an integrated circuit design, the method comprising:
searching the integrated circuit design for a predetermined base pattern, the base pattern comprising one or more logic elements, the predetermined sub-patterns describing circuit elements comparable to the circuit elements of the base pattern, but respective structures different from circuit element of the base pattern;
searching the integrated circuit design for one or more predetermined sub-patterns that are assigned to the base pattern, the sub-patterns having a similar arrangement of comparable circuit elements to the base pattern;
validating each found sub-pattern based on a predetermined rule; and
suppressing error notifications associated with a sub-pattern validated positively, thus advantageously reducing a number of error notifications output by the verification tool.

17. The non-volatile machine readable medium of claim 16, wherein the similar arrangement of comparable circuit elements comprises the base pattern and one or more of additional logic elements and interconnect.

18. The method according to claim 1, wherein one or more of the predetermined sub-patterns comprises an atomic variation of the base pattern.

19. The method according to claim 10, wherein one or more of the predetermined sub-patterns comprises a combination of multiple atomic variations of the base pattern.

* * * * *